United States Patent [19]

Long et al.

[11] 4,051,386
[45] Sept. 27, 1977

[54] FREQUENCY DOUBLING CIRCUIT

[75] Inventors: David K. Long; Robert W. Miller, both of Sunnyvale, Calif.

[73] Assignee: National Semiconductor Corporation, Santa Clara, Calif.

[21] Appl. No.: 707,729

[22] Filed: July 22, 1976

[51] Int. Cl.² ............................................. H03K 1/16
[52] U.S. Cl. ................................. 307/271; 307/261; 328/20; 331/113 R; 307/246
[58] Field of Search ................ 328/20; 307/246, 261, 307/271, 273, 228; 331/113 R

[56] References Cited
U.S. PATENT DOCUMENTS

| | | | |
|---|---|---|---|
| 3,281,715 | 10/1966 | Folz et al. | 307/271 X |
| 3,665,343 | 5/1972 | Thompson | 331/113 R |
| 3,725,681 | 4/1973 | Frederiksen | 307/273 |

*Primary Examiner*—John S. Heyman
*Attorney, Agent, or Firm*—Gail W. Woodward; Willis E. Higgins

[57] ABSTRACT

A frequency doubler circuit uses a single capacitor which is initially charged. A pair of switches is sequentially actuated so that each switch acts to first discharge the capacitor and then charge it in the opposite polarity. The switches are sequentially actuated from a differential input amplifier. Thus each input cycle will actuate both switches so as to discharge and charge the capacitor twice. Output logic senses the capacitor cycling and produces two output pulses for each input cycle.

5 Claims, 2 Drawing Figures

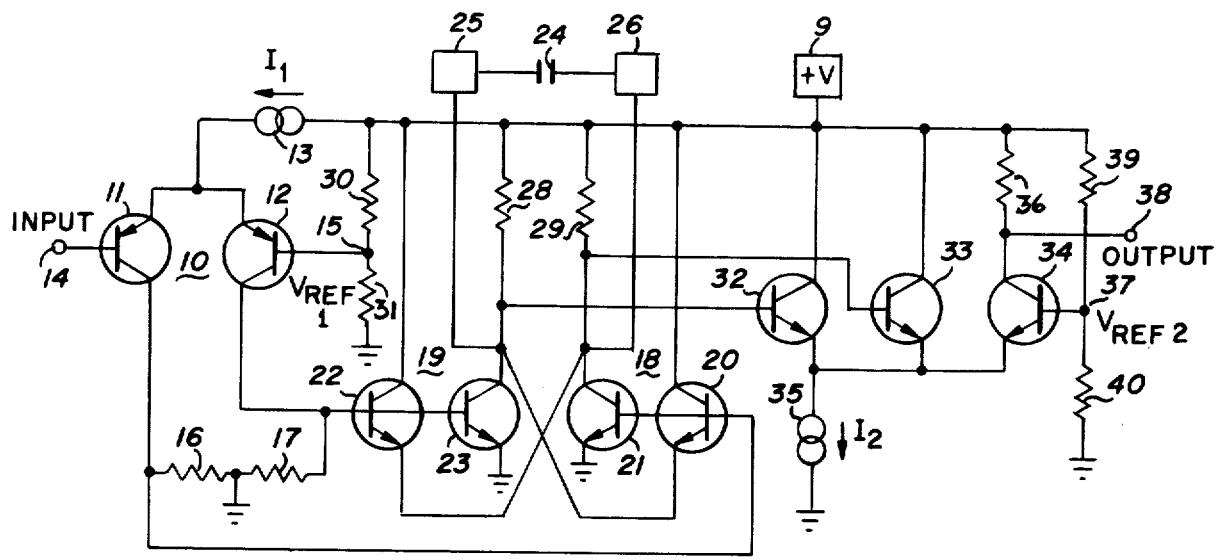
Fig._1
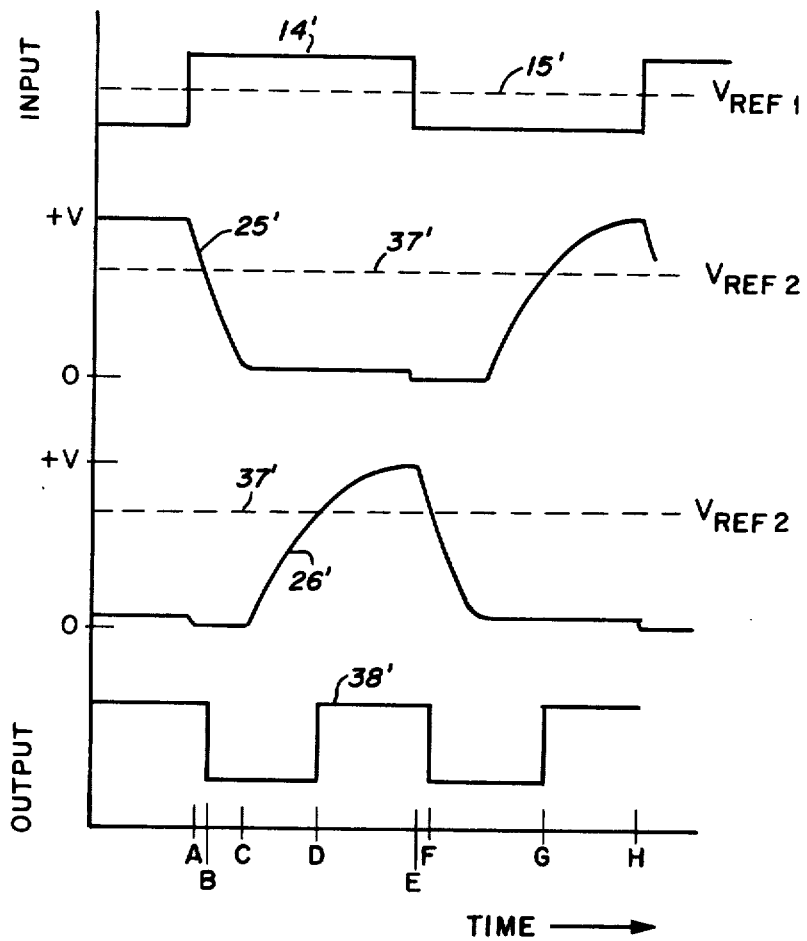
Fig._2

FREQUENCY DOUBLING CIRCUIT

BACKGROUND OF THE INVENTION

Frequency doubling is often used in electronic circuits. Where a single or narrow range of frequencies is encountered, resonant harmonic circuits are common. However, where a large range of frequencies is encountered, more complicated circuits must be employed. In one common application an electronic tachometer is used to count wheel or shaft revolutions. The rotor of an electromagnetic generator is attached to the shaft and the generator output frequency is proportional to shaft rotation rate. Typically the a-c signal is amplified, squared, rectified, and filtered to produce a d-c voltage proportional to speed. Clearly the filter must have a long time constant to do an adequate filtering job at the lower frequencies. Such filters have a slow response to changes in voltage. If the generator frequency is electronically doubled, the related filter can be designed to have doubled response speed. Accordingly, where response speed is marginal, this technique is widely used.

In prior art frequency doubling, one technique has been to square up the a-c input in an amplifier limiter, differentiate the resulting square wave, invert every other pulse and use the pulses to trigger a one shot multivibrator or equivalent circuit. Alternatively, the differentiated signals can be clipped and shaped, including inverting every other pulse, and used directly as a frequency doubled output. These schemes are either complicated and use much circuitry or are imprecise. Attempts to simplify the prior art circuits have also been complicated. Typically a matched pair of capacitors are alternately charged and discharged by alternate half input cycles to produce a pair of controlled width output pulses for each input cycle. It is important that each output pulse have the same width, hence the requirement for matched capacitor pairs. These are cumbersome as well as expensive.

SUMMARY OF THE INVENTION

It is an object of the invention to provide a circuit that doubles the frequency of an input wave using only a single capacitor.

It is a further object of the invention to produce a single capacitor frequency doubling circuit that is precise and amenable to integrated circuit fabrication.

It is a feature of the invention that frequency doubling is achieved in a circuit that is insensitive to temperature and has greatly reduced response to power supply voltage variations.

These and other objects and features are achieved in a circuit configured as follows. The input wave drives a differential amplifier, the other input of which is provided with a reference potential that results in alternating differential conduction. The differential amplifier drives a pair of switches that are symmetrically connected to a single capacitor. Each switch acts to first discharge the capacitor and then to charge it to the opposite polarity. Thus the capacitor is discharged and recharged twice for each input cycle. A logic circuit is used to sense the capacitor charging action and to produce two output pulses for each input cycle. Frequency doubling is achieved over a very wide frequency range and circuit symmetry permits using only one capacitor while assuring constant output pulse width.

BRIEF DESCRIPTION OF THE DRAWING

FIG. 1 is a schematic diagram of the circuit of the invention; and

FIG. 2 is a waveform graph showing the circuit voltages as a function of time.

DESCRIPTION OF THE INVENTION

FIG. 1 is a schematic diagram of the circuit of the invention. Since the circuit is intended primarily for integrated circuit use the square elements shown constitute pads for external component connection. The capacitor and power supply connections comprise the external elements. The input and output connections will be made to other elements on the IC chip and thus will not normally be external. Accordingly, it is to be understood that FIG. 1 represents only a part of a larger integrated circuit. Pad 9 marked +V is intended to contact the external power supply, the negative terminal of which is ground.

Transistors 11 and 12 are connected as a differential amplifier 10, which has a current source 13 in the emitter circuit producing a current $I_1$. An input signal is applied by way of terminal 14 and is operated against a reference potential $V_{REF1}$ which is applied to terminal 15. This reference potential is simply a potential between +V and ground. In FIG. 2 waveform 14' represents the input signal and 15' denotes $V_{REF1}$. While shown as being established by resistors 30 and 31 connected as a voltage divider across +V to ground, other means could be used to obtain $V_{REF1}$. It can be seen that the input signal operates around the reference potential so that the differential amplifier 10 conducts on first one side and then the other. Resistors 16 and 17 return the collectors of transistors 11 and 12 to ground potential.

Differential amplifier 10 operates a pair of switching circuits 18 and 19. Each switch contains a pair of transistors base driven in parallel. Since differential amplifier 10 is switched by the input signal, switches 18 and 19 are alternately turned off and on. When transistor 11 is on, $I_1$ will flow dominantly in the bases of transistors 20 and 21, thus turning them on. For this state, transistors 22 and 23 will be turned off because resistor 17 returns their bases to ground potential. When transistor 12 conducts, transistors 22 and 23 will be supplied with base current and turned on, while transistors 20 and 21 will be turned off.

While input signal 14' is shown as a square wave, this is not a necessary condition. If the waveform were a sine wave, for example, amplifier 10 would still conduct alternately and operate switches 18 and 19 sequentially. In practice amplifier 10 can act as a signal squaring amplifier provided that the input signal amplitude is sufficient.

The circuit operates to charge and discharge capacitor 24 in a manner to be described. Capacitor 24 is typically external to the IC and is connected by way of terminal pads 25 and 26. In FIG. 2 waveform 25' represents the signal on pad 25 and waveform 26' represents the signal on pad 26.

As shown at the left of FIG. 2, the input signal is low which turns transistor 11 on and transistor 12 off. Thus switch 18 is on and switch 19 off. For the conditions shown, transistor 21 will be in saturation and pad 26 will be $V_{CESAT}$ above ground. Pad 25 will be at +V due to the action of resistor 28. Thus capacitor 24 will be charged to almost +V potential.

At time A in FIG. 2 the input wave 14' goes high, thus turning transistor 11 off and transistor 12 on. This in turn turns switch 19 on and switch 18 off. Transistor 23 will pull the potential at pad 25 toward ground and transistor 22 will pull pad 26 toward +V. Thus capacitor 24 will start to discharge through two series transistors toward the opposite polarity potential and this action will occur rapidly. At time C waveform 25' reaches the $V_{CESAT}$ level of transistor 23. It will be noted that in the time interval A-C the voltage at pad 26 has bottomed out at zero. This is due to the combined clamping action of conducting transistors 22 and 23 which are desirably matched. The parallel connected bases will be one $V_{BE}$ above ground and the emitter of transistor 22 will be one $V_{BE}$ below this value, thus placing it very close to ground. This action causes the rising portion of waveform 26' to start from ground potential. At time C, capacitor 24 becomes fully discharged and current ceases to flow in transistor 22. The exponential rise of voltage at pad 26 is now caused by capacitor 24 being charged to +V through resistor 29 and transistor 23 which is held in saturation. Once pad 26 potential reaches +V it will remain at that level until the input signal 14' changes polarity at time E.

It will be noted that in time interval C-D, circuit timing is controlled by the transistor 20-capacitor 24 time constant. Since the waveform starts at zero rather than some arbitrary reference such as $V_{CESAT}$, the interval will be largely unaffedted by the other circuit elements and this greatly improves freedom from temperature effects. If the level of $V_{REF2}$ is scaled relative to +V, as, for example, by a voltage divider as shown, any increase in +V that would tend to cause a more rapid charge of capacitor 24 would also increase $V_{REF2}$, thus causing waveform 26' to intersect 37' at the same time. This means that timing is independent of all circuit variables except the above mentioned R-C time constant.

At time E transistor 11 is turned on which switch 18 on and transistor 12 is turned off which turns switch 19 off. As shown in waveform 26' capacitor 24 discharges through transistor 20 and 21 then charges to +V through resistor 28 and transistor 21. It can be seen that the action is identical to that associated with switch 19 except that the sequence of events if reversed with respect to pads 25 and 26. It will be noted that waveform 25' and 26' are identical but shifted in time by the width of one half of the input waveform 14' cycle.

The signals present on pads 25 and 26 are applied to a logic circuit comprising transistors 32 - 34. These three transistors are connected into a common emitter configuration with a constant current source 25 supplying $I_2$ out of the combination. Transistors 32 and 33 have their bases directly coupled to pads 25 and 26 respectively, while their collectors are coupled to +V. The collector of transistor 34 contains load resistor 36. The base of transistor 34 is coupled to a second source of reference potential at terminal 37 labeled $V_{REF2}$ and obtained by resistors 39 and 40 acting as a voltage divider from +V. This reference potential is shown in FIG. 2 as dashed lines 37'. The value is selected to be between +V and the saturation voltage of an on transistor. Thus waveforms 25' and 26' will intersect lines 37' on their curving portions.

The arrangement of transistors 32 - 34 is such that transistor 34 will conduct only when both transistors 32 and 33 are non-conductive. Thus when waveforms 25' and 26' are both below the level of 37', transistor 34 will be on, $I_2$ will flow in resistor 36, and the output potential at terminal 38 will be low. The output is shown in FIG. 2 as waveform 38'. Terminal 38 potential will be low between time intervals B-D and F-G. It will remain high at all other times.

As can be seen by comparing waveforms 14' and 38', each input pulse produces two output pulses. Each transition of the input produces a rectangular output pulse having a duration dependent upon the value of capacitor 24, resistors 28 and 29, the value of the potential at terminal 37, and to some degree the conduction of the transistors. From an inspection of FIG. 2, if $V_{REF2}$ is raised toward +V, the negative going output pulse will become wider. If $V_{REF2}$ is lowered toward the level of $V_{CESAT}$, the negative going output pulses will get narrower.

In digital electronic terminology transistors 32 - 34 comprise a logic gate having two inputs and one output. The output is characterized as high unless both inputs are low in which case the output is low. In digital terms the output is 1 for input states of 11, 01, and 10. The output is 0 for input 00.

The conditions shown in connection with FIG. 2 represent operation near the upper limit of frequency for reliable circuit operation. At lower frequencies the width of negative output pulses will be the same but more widely spaced apart. Since the circuit is direct coupled, there is no real lower frequency limit. If still higher operating frequency is desired, a smaller value of capacitor 24 is employed and, if desired, smaller values of resistors 28 and 29 which are preferably the same value.

By way of an example, the circuit of FIG. 1 was employed using a capacitor having a value of 0.01 microfarad and resistors 28 and 29 were 20 kohms each. Reliable frequency doubling was observed over the range of 0 cps to 2200 cps. The reference voltages were made a fixed fraction of +V and it was noted that reliable circuit operation could be achieved over the range of 4 volts to 8 volts for +V.

The circuit is readily achieved in IC form. The transistor values are not critical. Resistors 16 and 17 are not critical and is most cases can be omitted entirely. Where the circuit is constructed in IC form, resistors 28 and 29 as well as capacitor 24 are desirably connected externally. Thus the resistors can easily be trimmed for a match and to give the circuit a wide frequency range capability. However, if desired, resistors 28 and 29 can be integrated into the IC. This is feasible because their values need to be matched and this is readily achieved in IC processing.

The foregoing has disclosed a frequency doubling circuit using only a single capacitor and having symmetrical operating characteristics. Clearly numerous equivalents and alternatives will occur to a person skilled in the art. For example, while a resistor 36 is shown as a load element, it could be replaced by a current source. Also sources 13 and 35 could be high value resistors or J FET's operated in pinch off. Accordingly, we intend that our invention be limited only by the following claims.

We claim:

1. A frequency doubling circuit having an input for accommodating an input signal, including driver means responsive to said input signal for operating said circuit and means for coupling said circuit to first and second power supply terminals, said circuit comprising:

a capacitor having first and second terminals;

a first switching transistor having a collector coupled to said first capacitor terminal, an emitter coupled to said first power supply terminal, and a base coupled to said driver means;

a second switching transistor having an emitter coupled to said second capacitor terminal, a collector coupled to said second power supply terminal and a base coupled to said base of said first switching transistors;

a third switching transistor having a collector coupled to said second capacitor terminal, an emitter coupled to said first power supply terminal and a base coupled to said driver means;

a fourth switching transistor having an emitter coupled to said first capacitor terminal, a collector coupled to said second power supply terminal, and a base coupled to said base of said third switching transistor;

resistive means coupling each terminal of said capacitor to said second power supply terminal;

means in said driver means for driving said first and second switching transistor bases in phase opposition to said third and fourth switching transistor bases in response to said input signal; and output logic means coupled to said terminals of said capacitors whereby two output pulses are produced for each cycle of said input signal.

2. The circuit of claim 1 wherein said driver means comprise a differential amplifier.

3. The circuit of claim 2 wherein said logic means comprise three transistors having parallel emitter collector circuits, a constant current source between the emitters and said first power supply terminal, means coupling the collectors to said second power supply terminal and three base terminals;

means coupling the first of said three base terminals to said first capacitor terminal;

means coupling the second of said terminals to said second capacitor terminal;

means coupling the third of said three base three base terminals to a predetermined potential intermediate between the potential difference of said power supply terminals; and mean for producing an output signal in response to the current flowing in the third of said three transistors.

4. The circuit of claim 3 wherein said last named means comprises resistive means coupling said collector of said third of said three transistors to said second power supply terminal.

5. The circuit of claim 3 wherein said last named means comprises a current source coupled between said collector of said third of said three transistors and said second power supply terminal.

* * * * *